United States Patent
Hodate et al.

[11] Patent Number: 5,518,940
[45] Date of Patent: May 21, 1996

[54] METHOD OF MANUFACTURING THIN FILM TRANSISTORS IN A LIQUID CRYSTAL DISPLAY

[75] Inventors: Mari Hodate; Norihisa Matsumoto; Kohji Ohgata; Tamotsu Wada; Ken-iti Yanai; Ken-ichi Oki; Yasuyoshi Mishima; Michiko Takei; Tatsuya Kakehi; Masahiro Okabe, all of Kanagawa, Japan

[73] Assignee: Fujitsu Limited, Japan

[21] Appl. No.: 368,906

[22] Filed: Jan. 5, 1995

[30] Foreign Application Priority Data

Mar. 10, 1994 [JP] Japan .................................. 6-040114

[51] Int. Cl.⁶ ........................................... H01L 21/8232
[52] U.S. Cl. .................... 437/41; 437/21; 437/44; 437/170; 437/229; 204/485; 204/487
[58] Field of Search .................. 437/41, 44, 229, 437/170; 216/41; 430/319; 204/181.1

[56] References Cited

U.S. PATENT DOCUMENTS

| | | | |
|---|---|---|---|
| 3,954,587 | 5/1976 | Kokawa | 204/181 |
| 4,592,816 | 6/1986 | Emmons et al. | 204/180.6 |
| 4,786,609 | 11/1988 | Chen | 437/44 |
| 4,837,173 | 6/1989 | Aluis et al. | 437/44 |
| 4,965,213 | 10/1990 | Blake | 437/44 |
| 5,158,657 | 10/1992 | Kadokuna | 204/181.1 |
| 5,399,449 | 3/1995 | Tanimoto et al. | 204/181.1 |

FOREIGN PATENT DOCUMENTS 4-14262  1/1992  Japan .

Primary Examiner—Tom Thomas
Attorney, Agent, or Firm—Greer, Burns & Crain, Ltd.

[57] ABSTRACT

A method of manufacturing a semiconductor device according to the present invention includes a process of introducing impurities into a semiconductor layer with a gate electrode and a resist film as a mask after a resist film is formed on the top and the side of the gate electrode by soaking the gate electrode on a semiconductor layer in an electrolyte containing resist and applying voltage to the gate electrode.

21 Claims, 12 Drawing Sheets

METHOD OF MANUFACTURING THIN FILM TRANSISTORS IN A LIQUID CRYSTAL DISPLAY

BACKGROUND OF THE INVENTION

1. Field of the Invention

The present invention relates to a semiconductor device and a method of manufacturing the same, and more particularly to a semiconductor device provided with an insulated gate field effect transistor used in an element for driving a microprocessor, a microcomputer, a semiconductor memory or a liquid crystal display, and a method of manufacturing the same.

2. Description of the Prior Art

Various research and development is being conducted with respect to achieving micronization and high integration of a semiconductor element.

In particular, the development of technique of micronizing an insulated gate field effect transistor called a Metal Insulator Semiconductor FET (MISFET) is remarkable. The micronization of a MISFET is achieved by shortening a length of a gate electrode in channel length direction. That the length of a gate electrode is shortened means naturally that the length of a channel region thereunder, i.e., the channel length is shortened. This fact means that the time required for carriers to pass through the channel region is reduced, thus resulting in a higher speed along with greater integration.

When the gate electrode is shortened, however, hot electrons are produced by a short channel effect, thus bringing about threshold voltage variation or lowering of channel conductance.

Namely, in a conventional structure a channel region composed of a first conductive type impurity diffused layer of low concentration is put between a source region and a drain region composed of a second conductive type impurity diffused layer of high concentration, an electric field applied to the vicinity of a boundary among a source region, a drain region and a channel region is increased in a state that voltage is applied between the source region and the drain region as the channel region is narrowed. As a result, the operation of a MISFET becomes very unstable.

A new structure of a MISFET that has been explicated for the purpose of controlling such a short channel effect is a structure of a Lightly Doped Drain (LDD). The LDD has a layer structure of a deep high impurity concentration region and a shallow low impurity concentration region formed in a source region and a drain region, and the low impurity concentration region of these regions stretches out a little toward the gate electrode. It has become possible to reduce the electric field produced in the vicinity of the boundary among the source region, the drain region and the channel region, thereby to stabilize the operation of the element by the LDD.

An example of a method of manufacturing a conventional insulated gate field effect transistor will be shown in FIGS. 1A to 1C.

First, as shown in FIG. 1A, a gate electrode 104 is formed through a gate oxide film 103 on a surface of a p-type semiconductor substrate 101 surrounded by a field insulating film 102. The gate oxide film 103 and the gate electrode 104 are formed through a film forming process and a photolithography process.

Then, n$^-$ type impurity diffused regions 105 and 106 having comparatively low impurity concentration are formed in a self-align manner by ion implantation using the gate electrode 104 and the field insulating film 102 as a mask.

Then, after an insulating film such as PSG and $SiO_2$ are formed by chemical vapor deposition (CVD) on the whole body so as to cover the gate electrode 104 and the n$^-$ type impurity diffused regions 105 and 106, the insulating film is etched anisotropically in a perpendicular direction and made to remain locally on the side of the gate electrode 104 as shown in FIG. 1B. There is reactive ion etching (RIE) as anisotropic etching technique.

The remaining insulating film is called a spacer or a side wall in general. Further, n$^+$ type impurity diffused regions 108 and 109 having high impurity concentration such as those shown in FIG. 1C are formed in a self-aligning manner by ion implantation for a second time using the gate electrode 104 and a side wall 107 as the mask.

Then, an interlayer insulating film 110 is formed on the whole body, and contact holes are formed therethrough, thereby to connect a source electrode 111 and a drain electrode 112 to the n$^+$ type impurity diffused regions 108 and 109.

With this, an insulated gate field effect transistor having an LDD structure is formed in an element forming region.

A process of manufacturing an n-type MIS has been described above, but a p-type MIS is also formed through an almost similar process.

According to the process described above, however, since the side wall 107 on the side of the gate electrode 104 is formed by anisotropic etching, irradiation angles of ions used for etching become uneven and the width of the side wall 107 is dispersed when the substrate becomes large in size.

In a step of forming the side wall 107, since a process of depositing an insulating film in a reducing room is included, the processing speed drops and the period of time for etching the insulating film in a perpendicular direction further becomes necessary, which incur lowering of a throughput.

A semiconductor element having an LDD structure is formed on an insulative substrate such as a glass substrate and used as an active element of a liquid crystal display sometimes.

Since, the glass substrate used for the liquid crystal display has a tendency of forming a large area, a film thickness of an insulating film (such as PSG) forming the side wall is different depending on the location on the same substrate, and dispersion of the width of the side wall on the side of the gate electrode is increased. Further, the dispersion in the configuration of the side wall makes it difficult to control an impurity ion implantation quantity, therefore the characteristics of a thin film transistors formed on the same substrate are uneven.

There is a method of making an operation speed sufficiently high on condition that a short channel is made by making an aspect ratio higher by increasing the height of the gate electrode 104 so as to increase the sectional area of the gate electrode 104 and reducing the resistance of the gate electrode 104. The aspect ratio is a ratio of the height to the width (the width in the channel length direction).

In a conventional LDD, however, it has been impossible to increase the aspect ratio without restriction because of a problem in a manufacturing process. This is due to such a reason that the width of the side wall 107 formed by anisotropic etching depends on the height of the gate electrode 104. Normally, the width of the side wall 107 reaches 20% or more of the height of the gate electrode 104. When the width of the side wall 107 becomes wider, the n⁻ type impurity diffused regions 105 and 106 become wider and the resistance between a source and a drain is increased, thus deteriorating transistor characteristics.

SUMMARY OF THE INVENTION

The present invention has been made in view of such a problem, and has for its object to provide a semiconductor device in that a side wall on a side of an electrode is formed with a high throughput and control of the width of the side wall is improved, and a method of manufacturing the same.

In the present invention, resist formed by electrodeposition is used in lieu of an insulating film by a chemical vapor deposition method as a side wall formed on both sides of a gate electrode.

It has been found that, in a resist film by electrodeposition, it is possible to obtain desired film thickness and width of resist selectively on a surface of a gate electrode only by controlling the magnitude and the application time of voltage for depositing the resist. Namely, the side and the top of the gate electrode are covered with resist by soaking the gate electrode of a MISFET in electrolyte containing ionized resin and applying the appropriate voltage to the gate electrode in the electrolyte containing ionized resin for ten seconds.

As a result, since it is not required to form a side wall through growth and etching of an insulating film as in a conventional method of manufacturing an LDD, the process is simplified and the productivity is improved.

The film thickness of the resist film obtained by electrodeposition is almost the same on both the top and the side of the gate electrode, and in addition, a homogeneous film is obtainable. Further, neither unevenness in thickness nor difference in the film quality depending on the location on the substrate are found. As a result, the resist film is very effective as a mask material when ion implantation is performed, and a side wall is formed more simply, faster and more accurately than prior art.

In particular, since unevenness of the width of the side wall at respective positions of the substrate surface is not generated when a thin film transistor that is a MISFET is manufactured on a substrate having a large area, a thin film transistor of high reproducibility is obtainable.

Further, since no restriction is made by the height of the gate electrode as in the prior art, a selection latitude of the aspect ratio of the gate electrode is expanded, and formation of the side wall does not restrict the thickness of the gate electrode.

Furthermore, since it is selected whether the resist is formed on the surface of the gate electrode or not by whether the voltage is applied or not, it is possible to form a semiconductor element showing different characteristic in the same substrate plane. For example, it becomes possible to selectively increase the film thickness of the resist around the gate electrode of a first MISFET by applying up to 0 volt to the gate electrode of a second MISFET selectively after forming the resist around the gate electrode by applying the voltage to respective gate electrodes of the first MISFET and the second MISFET for a predetermined period of time.

Furthermore, since electrodeposited resist is used as a ion resistant mask for forming an LDD region in the present invention, it becomes possible to control the width and the impurity concentration distribution of the LDD delicately by controlling the film thickness of the resist.

DESCRIPTION OF THE PREFERRED EMBODIMENTS

The First Embodiment

Figure 1A:
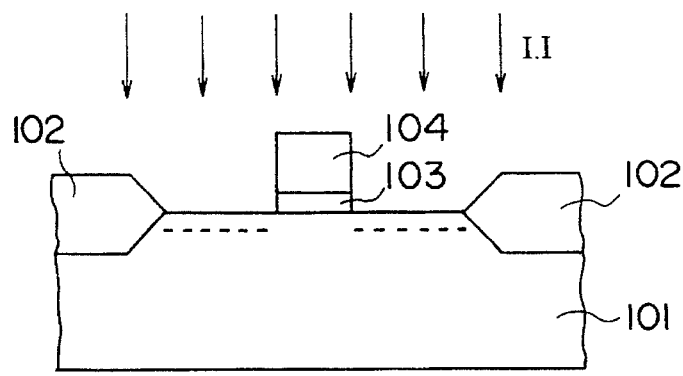
FIGS. 1A to 1C are sectional views showing a process of manufacturing a semiconductor device according to a prior art.
Figure 1B:
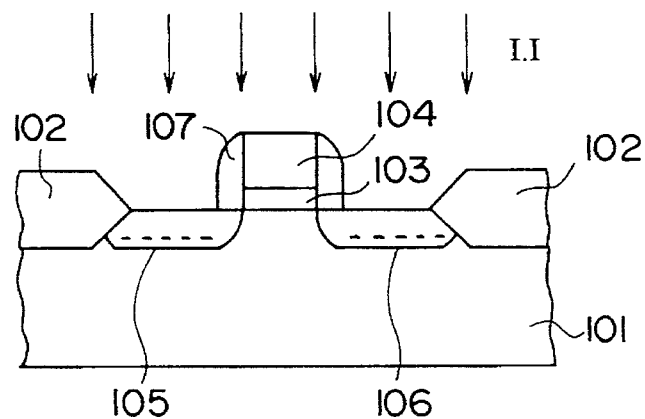
Figure 1C:
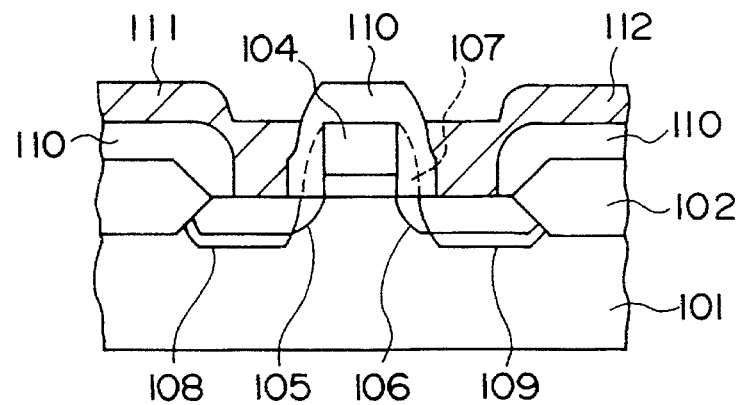
Figure 2A:
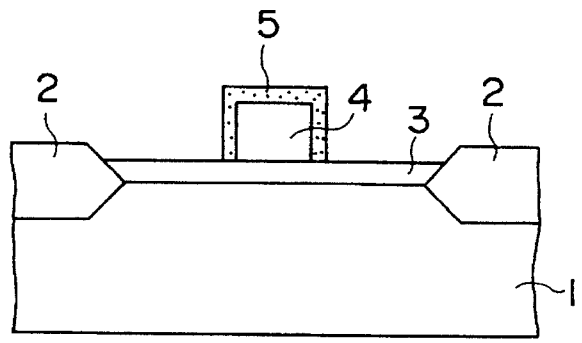
FIGS. 2A to 2C are sectional views showing a process of manufacturing a semiconductor device according to a first embodiment of the present invention.

A method of manufacturing a MIS field effect transistor of the present invention will be described with reference to sectional views in FIGS. 2A to 2C. First, a process until a state shown in FIG. 2A is obtained will be described.

After a field insulating film 2 is formed around an element forming region on a semiconductor substrate 1 composed of p-type silicon by local oxidation of silicon, a gate insulating film 3 is formed on the surface of the semiconductor substrate 1 in the element forming region. The field insulating film 2 is grown selectively in a thickness of 800 nm for instance in an oxygen atmosphere at 1,000° C. A silicon oxide film formed in a thickness of 50 nm by thermal oxidation is applied to the gate insulating film 3.

Then, after a polycrystalline silicon film containing impurities such as phosphorus and arsenic all over is formed in a thickness of 500 nm at a growth temperature of 800° C. by low-pressure CVD, this polycrystalline silicon film is formed into a pattern of a gate electrode 4 by photolithography. The gate electrode 4 may be formed in a thickness larger than the width in the channel length direction (the same is applied to embodiments described hereunder).

Next, the semiconductor substrate 1 and the gate electrode 4 are soaked in an electrolyte not shown, and an anode of an electrode for electrodeposition soaked in the electrolyte is connected to the gate electrode 4. Then, when voltage at 10 V is applied between a cathode and an anode of the electrode for electrodeposition for 20 seconds thereby to stick a resist film 5 onto the top of the gate electrode 4 in a thickness of approximately 0.6 μm, the width in a channel length direction of the resist film 5 on the side of the gate electrode 4 becomes approximately 0.5 μm. A method of sticking resist to a conductive film by soaking the conductive film in an electrolyte and applying voltage to the conductive film is called electrodeposition or an electrodeposition resist method. The electrolyte is a solution containing resist as a component thereof.

Since precise control of the film thickness becomes difficult when the resist becomes thicker than 2 μm or more, controllability of the thickness as a mask for later ion implantation is deteriorated. Further, since the controllability of the thickness of resist is also deteriorated in the state that resist is liable to be accumulated at the corner between the side of the gate electrode 4 and the gate insulating film 3, it is desirable to electrodeposit the resist at low voltage of 30 V or lower.

The entire semiconductor substrate 1 is washed by water after electrodeposition of the resist film 5 is completed, and then is dried in an oven under the conditions of 140° C. for one hour, thereby to harden the resist. In this case, an example using thermosetting type resist is shown, but other types of resist may also be used (the same is applied to the resist in the embodiments described hereinafter). The thermosetting type resist flows and Gets out of shape without hardening at a heating temperature of 100° C. or lower.

Figure 2B:
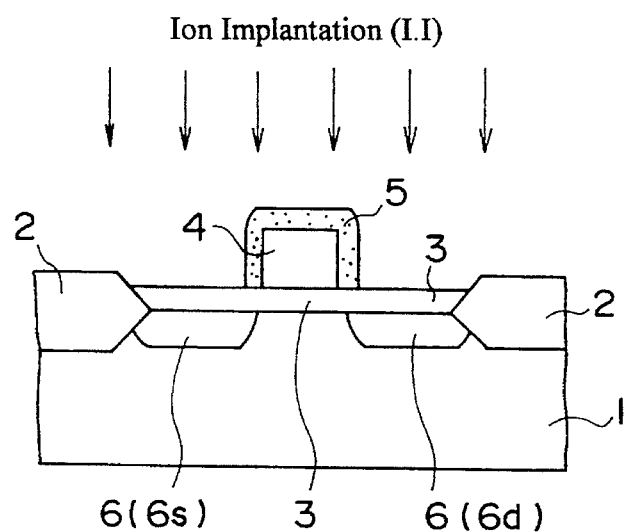

Next, ions of n-type impurities such as phosphorus and arsenic are implanted at a dose of $5\times10^{15}$cm$^{-2}$ as shown in FIG. 2B. The acceleration energy of ion implantation is set to such a level that at least a part of impurities penetrate through the gate insulating film 3 on both sides of the gate electrode 4 (the same is also applied to the embodiments described hereinafter).

Then, when the semiconductor substrate 1 is annealed at approximately 850° C., implanted impurities are activated and spread in a horizontal direction, and an n$^+$ impurity diffused layer 6 is formed in the semiconductor substrate 1 on both sides of the gate electrode 4. The n$^+$ impurity diffused layer 6 forms a source region 6s and a drain region 6d.

In this case, the spread quantity of the n$^+$ impurity diffused layer 6 by annealing can be regulated by controlling applied voltage and application period of time at time of resist electrodeposition so as to vary the width of the resist film 5. Accordingly, the n$^+$ impurity diffused layer 6 is formed at a position where the end of the layer 6 does not lie on the gate electrode 4 by adjusting the width of the resist film 5, thus preventing the channel length from becoming shorter than required so as to make it more difficult to produce a short channel effect.

It becomes possible to form the n$^+$ impurity diffused layer 6 without spreading under the gate electrode 4 by using the resist by electrodeposition operable simply and in a short period of time as described above as a side wall.

When gate electrode 4 and the n$^+$ impurity diffused layer 6 overlap each other, various problems in the electric field concentration are produced at the overlapped portion and a leak current passes when high voltage is applied to the gate electrode 4 and so on are generated, but such problems have been solved by the present embodiment.

Figure 2C:
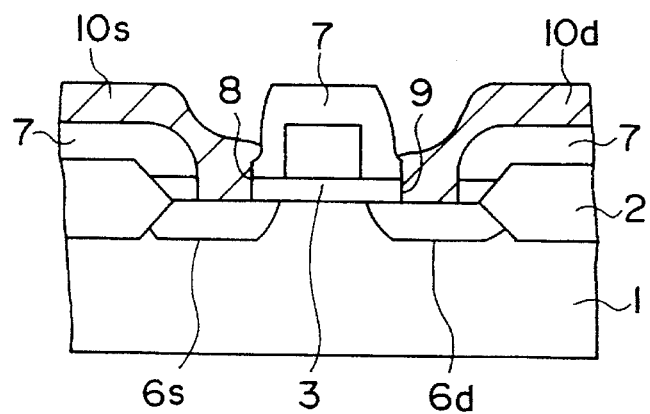

After the resist film 5 is removed, as shown in FIG. 2C, after an interlayer insulating film 7 such as SiO$_2$ and PSG that covers the gate electrode 4 and the gate insulating film 3 is grown by CVD, contact holes 8 and 9 are opened in the gate insulating film 3 and the interlayer insulating film 7 on a source region 6s and a drain region 6d by photolithography. Then, a source electrode 10s and a drain electrode 10d connected to the source region 6s and the drain region 6d through the contact holes 8 and 9 are formed on the interlayer insulating film 7.

Since the resist film 5 also functions as an insulating film, the process may be shifted to the growth process of the interlayer insulating film 7 while leaving the resist film 5 as it is unless bad influence is exerted upon the control of other film thickness.

Through the process described above, an MIS field effect transistor is formed.

The Second Embodiment

Figure 3A:
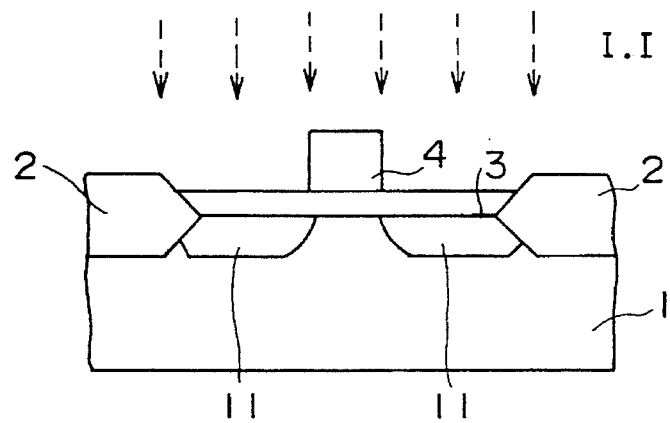
FIGS. 3A to 3C are sectional views showing a process of manufacturing a semiconductor device according to a second embodiment of the present invention.
Figure 3B:
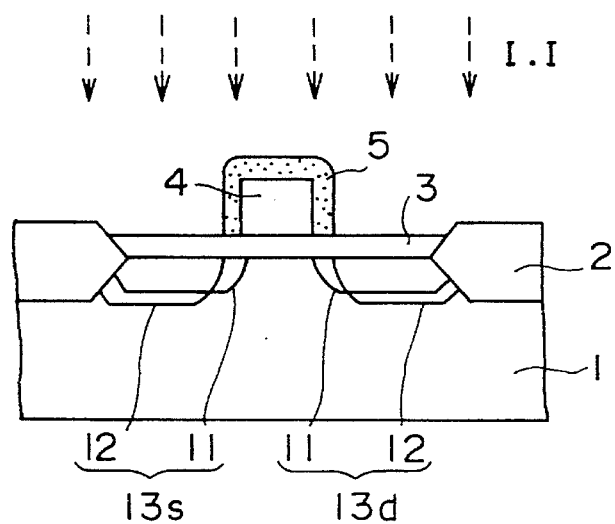
Figure 3C:
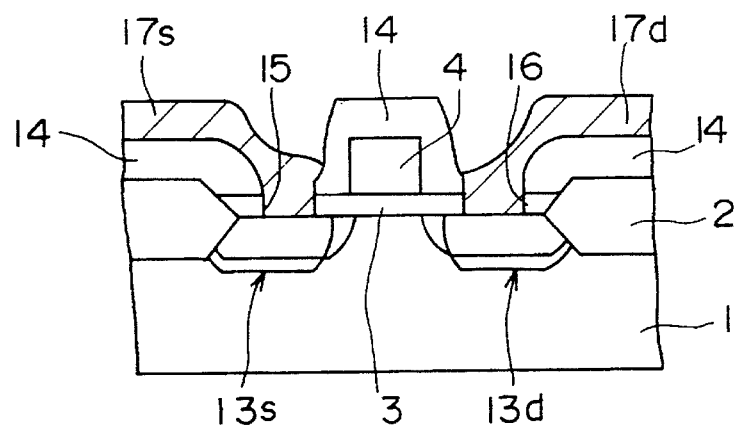

FIGS. 3A to 3C show sections of a manufacturing process of an insulated gate semiconductor device according to a second embodiment. In the present embodiment, a case of applying the present invention to an n-type MISFET having an LDD structure will be explained.

First, a process shown in FIG. 3A will be described.

A field insulating film 2, a gate insulating film 3 and a gate electrode 4 are formed on a semiconductor substrate 1 composed of p-type silicon by a method similar to the method of the first embodiment.

In such a state, as shown in FIG. 3A, phosphorus ions for instance are implanted at acceleration voltage of 120 KeV from above the gate insulating film 3 with the gate electrode 4 as a mask so as to form a first impurity introduced region 11 having impurity concentration of $2\times10^{-18}$cm$^{-3}$ in a self-align manner on the semiconductor substrate 1 on both sides of the gate electrode 4.

Next, a resist film is formed on the top and the side of the gate electrode 4 by electrodeposition described in the first embodiment.

As to the method of forming the resist film 5, when the semiconductor substrate 1 and the gate electrode 4 are soaked in an electrolyte, voltage at 10 V is applied to the gate electrode 4 for 20 seconds so as to deposit the resist film 5 in approximately 0.6 μm on the top of the gate electrode 4, the width in the channel length direction of the resist film 5 on the side becomes approximately 0.5 μm, which serves as a side wall. It is similar to the first embodiment to use an electrode for electrodeposition at time of electrodeposition.

When the resist film 5 having a thickness of 2 μm or more is formed at this time, resist is liable to be accumulated at edge portions of the side of the gate electrode 4 and the gate insulating film 3, thus deteriorating the controllability of a resist pattern that becomes a mask in later ion implantation. In order to make it easy to control the film thickness of the resist film 5, it is desirable to set the applied voltage in the case of electrodeposition to 0 V or lower.

After the electrodeposition of the resist film 5 is completed, surfaces of respective layers on the semiconductor substrate 1 are washed by water, and then the surfaces are dried in an oven at a temperature of 140° C. for one hour.

A process until a state shown in FIG. 3B is obtained is as follows.

After drying, phosphorus ions are implanted at acceleration voltage of 150 KeV from above the gate insulating film 3 thereby to form a second impurity introduced region 12 having impurity concentration of $5 \times 10^{20} \text{cm}^{-3}$ in a self-align manner on the semiconductor substrate 1 on both sides of the gate electrode 4. The second impurity introduced region 12 has higher concentration than that of the first impurity introduced region 11 and is formed deeper.

When the impurities in the impurity introduced regions 11 and 12 are stabilized by annealing at approximately 850° C., impurity diffused layers having an LDD structure are formed on both sides of the gate electrode 4. The impurity diffused layer on one side of the gate electrode 4 is used as a source region 13s and the impurity diffused layer on another side thereof is used as a drain region 13d.

Following to removal of the resist film 5, a PSG film is formed in a thickness of 800 nm using a low-pressure CVD method as an interlayer insulating film 14 as shown in FIG. 3C similarly to the conventional manufacturing process of a semiconductor element. Besides, since the resist film 5 also functions as an insulating film, the process may be shifted to the next process while leaving the resist film 5 as it is unless bad influence is exerted upon the control of other film thickness.

Thereafter, contact holes 15 and 16 for forming electrodes are opened in the interlayer insulating film 14, and then a source electrode 17s and a drain electrode 17d composed of aluminum that are connected to the source region 13s and the drain region 13d through the contact holes 15 and 16 are formed on the interlayer insulating film 14. An n-channel type FET having an LDD structure is formed as described above.

According to the process described above, the width of the resist formed on the side of the gate electrode can be controlled freely without being affected by the film thickness of the gate electrode. Therefore, the selection range of the aspect ratio of the gate electrode is expanded, and the width of the side wall is not widened even when the gate electrode is made thicker in order to reduce electric resistance. Accordingly, it does not occur that the width of a shallow impurity diffused layer of an LDD structure is expanded too wide and the resistance between source and drain is increased, thus improving transistor characteristics.

Besides, the sequence of forming the $n^-$ type impurity introduced region and the $n^+$ type impurity introduced region may be reversed with respect to the LDD structure. In other words, this is such a method that resist is electrodeposited immediately after forming the gate electrode, an $n^+$ type impurity introduced region is formed in a Si substrate by ion implantation with high dose, and ion implantation with low dose is performed with the gate electrode itself as a mask after the resist is peeled off, thus forming an $n^-$ type impurity introduced region.

The Third Embodiment

Figure 4A:
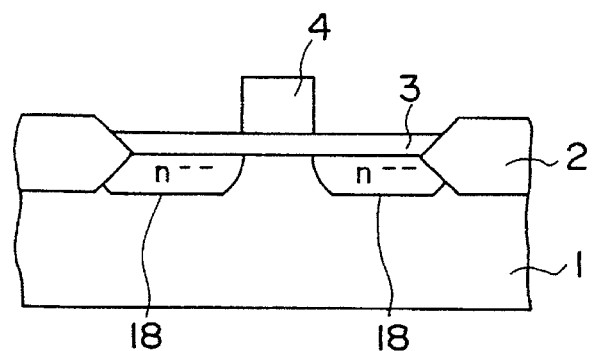
FIGS. 4A to 4C are sectional views showing a process of manufacturing a semiconductor device according to a third embodiment of the present invention.
Figure 4B:
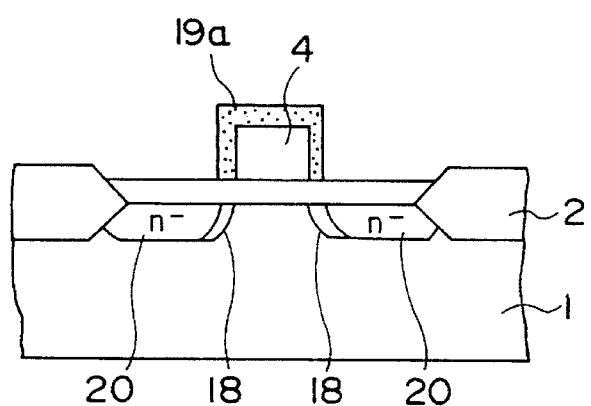
Figure 4C:
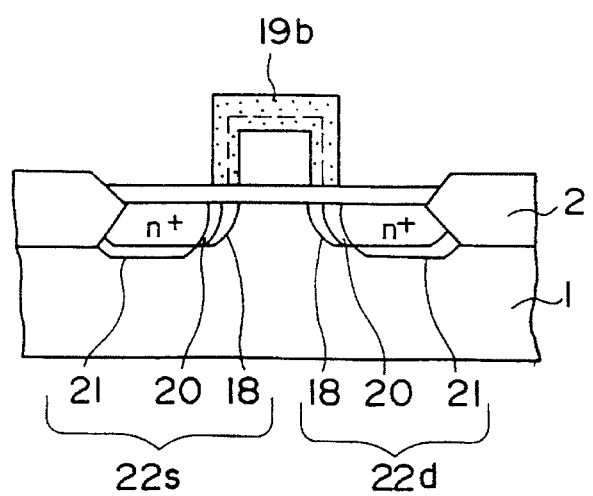

FIGS. 4A to 4C show a manufacturing process of a third embodiment of a MIS field effect transistor (FET).

First, a process until a state shown in FIG. 4A is obtained will be described.

Similarly to the first embodiment, a field insulating film 2, a gate insulating film 3 and a gate electrode 4 are formed on a semiconductor substrate 1 composed of p-type silicon. After patterning of the gate electrode 4, ions of n-type impurities such as phosphorus or arsenic are implanted into the semiconductor substrate 1 using the gate electrode 4 as a mask, thereby to form an $n^{--}$ type impurity introduced region 18 having impurity concentration of $1 \times 10^{17} \text{cm}^{-3}$.

Next, similarly to the first embodiment, the semiconductor substrate 1 is put into an electrolyte, and, as shown in FIG. 4B, voltage at 10 V is applied to the gate electrode 4 for 20 seconds thereby to electrodeposit a resist film 19a onto the gate electrode 4, which is continued until the width thereof reaches 0.6 μm on the side of the gate electrode 4.

Then, the gate electrode 4 and the resist film 19a are used as a mask, and ion implantation of n-type impurities is made into the semiconductor substrate 1 on both sides of the gate electrode 4 while increasing the dose than the first time, thus forming an $n^-$ type impurity introduced region 20 having impurity concentration of $1 \times 10^{19} \text{cm}^{-3}$.

Thereafter, the semiconductor substrate 1 and the gate electrode 4 are soaked in the electrolyte again, voltage at 15 V is applied to the gate electrode 4 for 30 seconds so as to further electrodeposit a resist film 19b having a thickness of approximately 0.5 μm on the resist film 19a, and ions of n-type impurities are implanted with a dose higher than that in the second time with these resist films as a mask, thus forming an $n^+$ type impurity introduced region 21 having impurity concentration of $1 \times 10^{20} \text{cm}^{-3}$.

Then, the $n^{--}$ type impurity introduced region 18, the $n^-$ type impurity introduced region 20 and the $n^+$ type impurity introduced region 21 are annealed so as to stabilize the impurities and make them diffused at the same time. With this, as shown in FIG. 4C, a source region 22s and a drain region 22d are formed on both sides of the gate electrode 4.

In such a manner, a MIS field effect transistor having a source and a drain having such an LDD structure that the impurity concentration gets lower by stages as approaching from the source region 22s and the drain region 22d to the gate electrode 4 is formed.

Besides, by forming the resist a plurality of times while varying conditions of electrodeposition on the surface of the gate electrode 4 gradually and forming an impurity layer changing from the $n^-$ type to the $n^+$ type smoothly by increasing the impurity implantation quantity every time the thickness or width of the resist is increased, the electric field strength distribution becomes smooth and the depression effect of the leak current is increased.

The film thickness of the resist film has been increased gradually by using electrodeposition in a plurality of times in the above description, but it may also be arranged so that the resist film once formed is melted by annealing and the protruding quantity from the gate electrode 4 is increased by stages, thereby to widen the width of the resist as a side wall and to vary impurity concentration of the impurity introduced region gradually. One example of the concrete process is described as follows.

Voltage at 10 V is applied to the gate electrode 4 for 20 seconds in the electrolyte after the $n^{--}$ type impurity introduced region 18 is formed thereby to form the resist film 19a on the surface of the gate electrode 4. After the resist film 19a, the gate insulating film 3 and the field oxide film 2 are washed by water, they are dried in an oven at a temperature of 60° C. for 5 seconds. Then, the $n^-$ type impurity introduced region 20 such as described previously is formed using the gate electrode 4 and the resist film 19a as the mask. Furthermore, the $n^-$ type impurity introduced region 21 described previously may be formed by putting the semiconductor substrate 1 into the oven again and annealing it at 60° C. for 20 minutes thereby to melt the resist film 19a so as to expand it in a horizontal direction then performing ion implantation into the semiconductor substrate 1. With this, a MIS field effect transistor provided with a source and a drain having an LDD structure in which the impurity concentration gets lower gradually as getting closer to the gate electrode 4 is formed.

As described, highly precise adjustment of the impurity concentration distribution of the LDD structure cannot be achieved by using CVD growth or anisotropic etching.

Besides, since the resist film 5 also functions as an insulating film, the process may be shifted to the process of forming the interlayer insulating film, the source electrode and the drain electrode after the source region 22s and the drain region 22d are formed while leaving the resist film 5 as it is unless a bad influence is exerted on the control of other film thickness.

The Fourth Embodiment

Next, a method of manufacturing a thin film transistor (TFT) formed in a liquid crystal display device will be described as a fourth embodiment of the present invention.

An active matrix type liquid crystal display unit has a second substrate (hereinafter referred to as a TFT substrate) on which a TFT is formed and a first substrate on which a common electrode is formed, and a liquid crystal is put between these substrates.

Figure 5A:
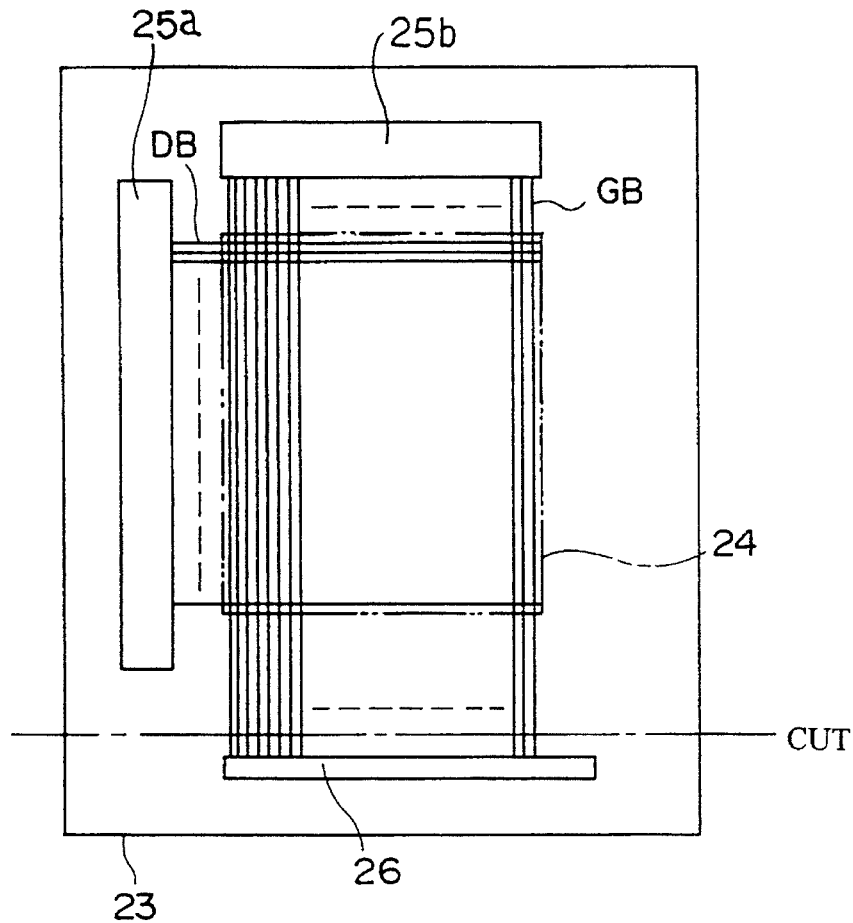
FIG. 5A and 5B are plan views showing an outline of a liquid crystal display unit applied with a fourth embodiment of the present invention.
Figure 5B:
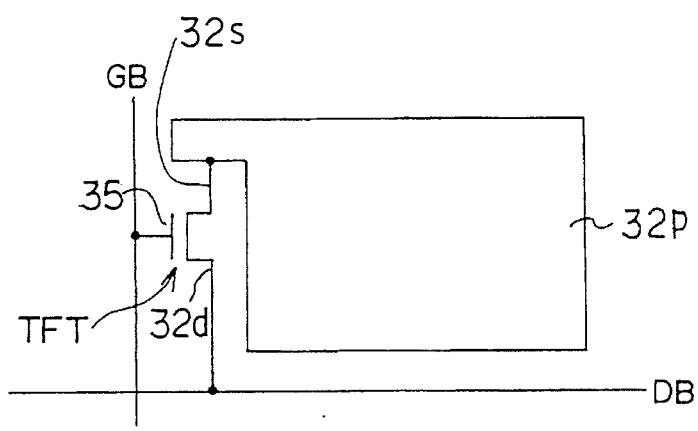

In the periphery of a pixel portion 24 of a TFT substrate 23 such as shown in FIG. 5A and 5B, peripheral circuit portions 25a and 25b required for driving the pixel portion 24 are arranged. An LDD structure is adopted sometimes for the TFT in the pixel portion 24, but it is not required to adopt the LDD structure in the peripheral circuit portions 25 since a large on-current is required there.

The peripheral circuit portions 25a and 25b are divided into a region connected to gate bus lines GB of the TFT in the pixel portion 24 and a region connected to drain bus lines DB. Further, a plurality of gate bus lines GB are short-circuited on the outside of the pixel portion 24 by means of a gate bus line control electrode 26 during the process of manufacturing the liquid crystal display unit.

Next, a process of forming the TFT having an LDD structure in the pixel portion 24 of the TFT substrate 23 and a process of forming the TFT constituting the peripheral circuit portions 25 will be described hereunder.

Figure 6A:
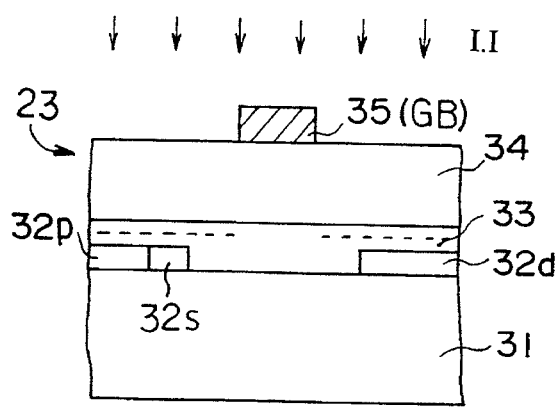
FIGS. 6A to 6C are sectional views showing a process of manufacturing a semiconductor element according to the fourth embodiment in a pixel portion of the liquid crystal display unit of the present invention.

First, in the pixel portion 24, a source electrode 32s and a drain electrode 32d composed of a conductive film such as Cr are formed on a transparent insulative substrate 31 such as glass and quartz as shown in FIG. 6A. The source electrode 32s is connected to a pixel electrode 32p composed of indium tin oxide (ITO), and the drain electrode 32d is connected to the drain bus lines DB.

In the transparent insulative substrate 31, the source electrode 32s, the drain electrode 32d and the region therebetween are covered with a polycrystalline silicon layer (a semiconductor layer) 33, and the polycrystalline silicon layer 33 is covered with a gate insulating film 34 composed of silicon nitride or silicon dioxide.

Furthermore, a gate electrode 35 composed of aluminum is formed in the region between the source electrode 32s and the drain electrode 32d on the top surface of the gate insulating film 34.

Figure 7A:
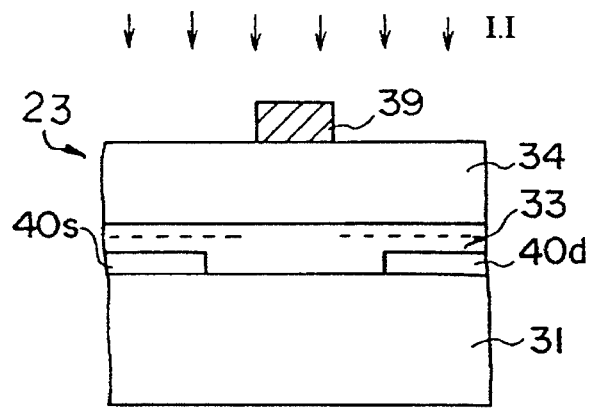
FIGS. 7A to 7C are sectional views showing a process of manufacturing a semiconductor element in a peripheral circuit portion of the liquid crystal display unit according to the fourth embodiment of the present invention.
Figure 7B:
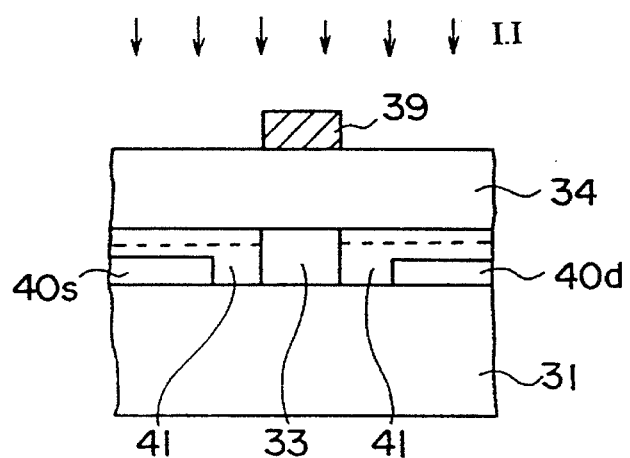

On the other hand, as shown in FIG. 7A, a source electrode 40s, a drain electrode 40d, a polycrystalline silicon layer 33, a gate insulating film 34 and a gate electrode 39 are formed one after another on the transparent insulative substrate in the peripheral circuit portion 25a and 25b similarly to the pixel portion 24. In this state, the gate electrode 39 of the TFT is separated electrically from the gate bus lines GB, the source electrode 40s is separated electrically from the pixel electrode, and the drain electrode 40d is not necessarily connected to the drain bus lines DB.

As shown in FIG. 6A and FIG. 7A, phosphorus ions are implanted into the polycrystalline silicon layer 33 at the acceleration voltage of 40 KeV and the dose of $1\times10^{13}$cm$^{-2}$ for instance using the gate electrodes 35 and 39 as the mask in the state described above, thereby to form first impurity introduced regions 37 and 41 in a self-align manner on the both sides of the gate electrodes 35 and 39.

Figure 6B:
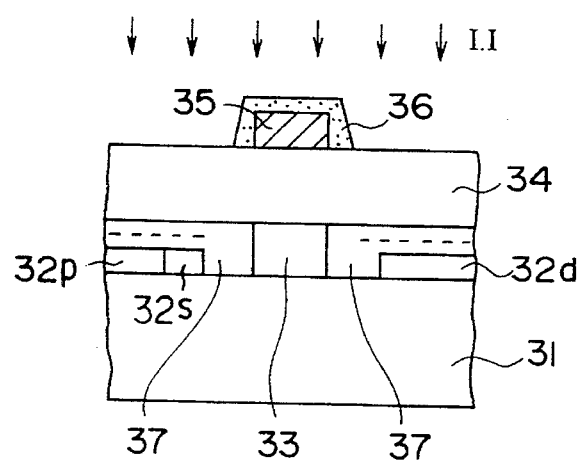

Next, the transparent insulative substrate 31 is soaked in an electrolyte, then voltage at 10 V is applied for 20 seconds to the gate electrode 35 through the gate bus line control electrode 26 shown in FIG. 5, and a resist film 36 is electrodeposited onto the surface of the gate electrode 35 of the pixel portion 24 in a thickness of a little less-than 0.6 μm as shown in FIG. 6B. In this state, since the gate electrode 39 of the TFT in the peripheral circuit portion 25a shown in FIG. 7A is not conducted electrically to the gate bus line control electrode 26, the resist does not stick to the gate electrode 39. Since the peripheral circuit portion 25b is placed outside the electrolyte, the resist does not stick to the gate electrode 39, which is for the TFT in the peripheral circuit portion 25b.

Then, after the transparent insulative substrate 31, the gate electrode 39 and so on are washed by water, they are dried in an oven at a temperature of 140° C. for one hour.

Thereafter, as shown in FIG. 6B, FIG. 6C, FIG. 7B and FIG. 7C, phosphorus ions are implanted at the acceleration voltage of 15 KeV and the dose of $1\times10^{-16}$cm$^{-2}$ from above the gate insulating film 34 using the gate electrodes 35 and 39 as the mask, thereby to form second impurity introduced regions 38, 41s and 41d in the polycrystalline silicon layer. In this case, the resist film 36 on the side of the gate electrode 35 of the TFT of the pixel portion 24 also functions as a mask.

Figure 6C:
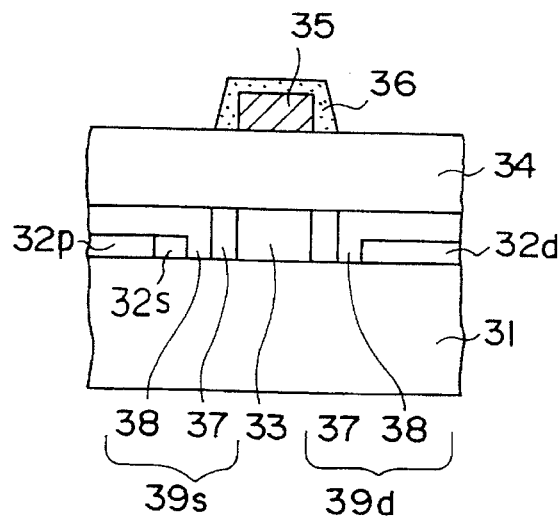

Therefore, as shown in FIG. 6C, a low concentration impurity region 37 and a high concentration impurity region 38 are in existence one after another in a direction of parting from the gate electrode 35 in the polycrystalline silicon layer 33 on both sides of the gate electrode 35 of the TFT in the pixel portion, thus forming a source region 39s and a drain region 39d having the LDD structure.

Figure 7C:
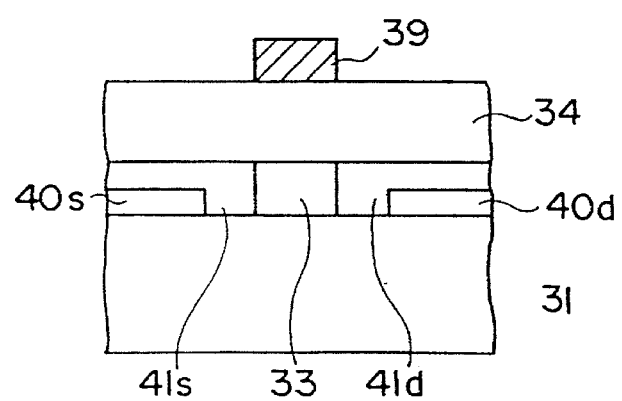

As against the above, only the high concentration impurity region is in existence as shown in FIG. 7C in the polycrystalline silicon layer 33 on both sides of the gate electrode 39 of the TFT of the peripheral circuit portion 25a and 25b, and a source region 41s and a drain region 41d having high concentration where there is no change in impurities are formed.

With the above, two types of TFTs having the source regions 39s and 41s and the drain regions 39d and 41d having different structures are formed in the pixel portion 24 and the peripheral circuit portion 25a and 25b without lowering the throughput. When a side wall is formed by CVD and anisotropic etching, the patterning process is increased and the process becomes complicated in order to form such two types of TFT structures.

Besides, since the gate bus line control electrode 26 is cut apart finally together with the transparent insulative substrate 31 as shown with a dashed line in FIG. 5, the gate bus lines are not short-circuited.

The Fifth Embodiment

Figure 8A:
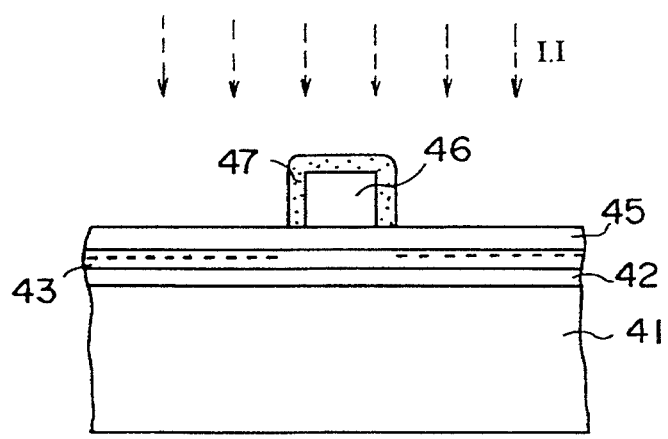
FIGS. 8A to 8C are sectional views showing a process of manufacturing a semiconductor device according to a fifth embodiment of the present invention.
Figure 8B:
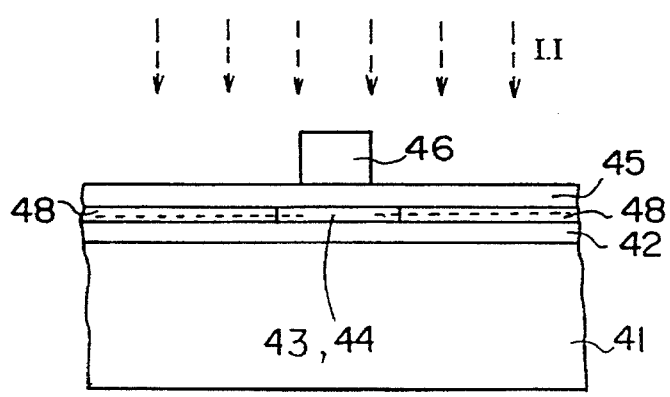
Figure 8C:
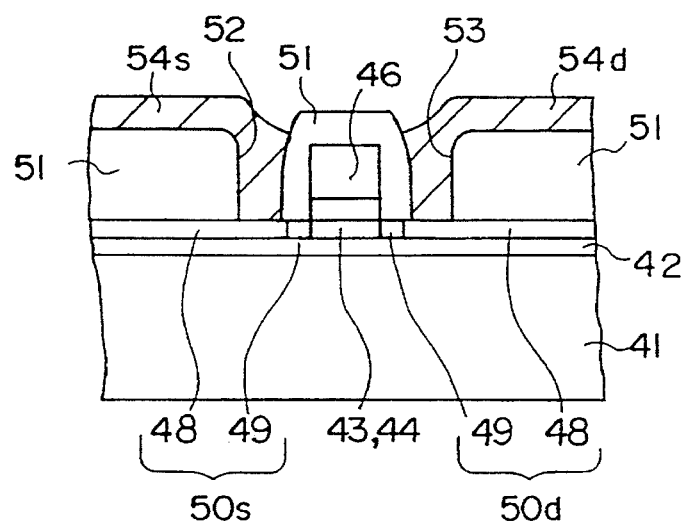

FIGS. 8A to 8C show a manufacturing process according to a fifth embodiment of an insulated gate FET. In the present embodiment, a process of manufacturing a p-channel TFT formed on a quartz substrate or a glass substrate is shown.

First, as shown in FIG. 8A, an oxide film 42 such as $SiO_2$ is formed in a thickness of 100 nm for instance at a low temperature (e.g. 400° C.) on an insulative transparent substrate 41 composed of quartz or glass by a low-pressure CVD method. Then, a silicon film (a semiconductor film) 43 in an amorphous state is formed in a thickness of 50 nm for instance by a low-pressure CVD method. Thereafter, solid phase growth is performed at a temperature of approximately 600° C. for instance, thereby to polycrystallize the silicon film 43. Aa to a method of polycrystallizing the silicon film 43 in an amorphous state, there is also a method of crystallizing the film by radiating an excimer laser light. Besides, a plasma CVD method or an photo-assisted CVD method may also be used other than the low-pressure CVD method for forming an amorphous silicon film. As the method of growing the silicon film 43, the film forming temperature may be made high from the beginning so as to perform microcrystallization or polycrystallization.

Next, after a gate insulating film 45 having a thickness of 100 nm is formed by an ECR plasma CVD method, an aluminum film having a thickness of 100 nm is formed by a sputtering method, and a gate electrode 46 is formed by applying patterning to the aluminum film. The width in a channel length direction of the gate electrode 46 is set to 3 μm for instance.

In such a state, a resist film 47 is formed on the top and the side of the gate electrode 46 by electrodeposition. As to the conditions of forming the resist film 47, for example, the gate electrode 46 is soaked in an electrolyte, and voltage at 10 V is applied to the gate electrode 46 for 20 seconds so as to grow the resist film 47 in a thickness of 0.5 μm on the surface of the gate electrode 46, and the resist film 47 is used as a side wall. After the electrodeposition of the resist film 47 is completed, the insulative transparent substrate 41 and the exposed surface of the film thereon are washed by water, and are dried in an oven at 140° C. for one hour.

In this state, phosphorus ions are implanted into the silicon film 43 under the conditions that the acceleration voltage is 15 KeV and the dose is $1 \times 10^{16} cm^{-2}$ from above the gate insulating film 45 using the gate electrode 46 and the resist film 47 as the mask, thereby to form a first impurity region 48 such as shown in FIG. 8B.

Next, after the electrodeposited resist film 47 that has grown on the top and the side of the gate electrode 46 is removed, phosphorus ions are implanted into the silicon film 43 under the conditions that the acceleration voltage is 40 KeV and the dose is $1 \times 10^{13} cm^{-2}$. With this, a second impurity region 49 such as shown in FIG. 8C is formed in the silicon film 43 located between the edge portion of the first impurity region 48 and the edge portion of the gate electrode, and the concentration of the first impurity region 48 is increased.

The first and the second impurity regions 48 and 49 are activated by annealing, and form a source region 50s and a drain region 50d having the LDD structure on both sides of the gate electrode 46. Next, the gate insulating film 45 at a part that is not covered by a mask is removed using the gate electrode 46 as the mask.

Thereafter, a $SiO_2$ film is formed in a thickness of 500 nm using a low-pressure CVD method for instance as an interlayer insulating film 51 similarly to a conventional process of manufacturing a semiconductor element. Thereafter, contact holes 52 and 53 for forming electrodes are opened in the interlayer insulating film 51 on the high impurity concentration regions of the source region 50s and the drain region 50d, and a source electrode 54s and a drain electrode 54d are formed therefrom In such a manner as described above, a TFT element having the LDD structure is formed.

The Sixth Embodiment

Figure 9A:
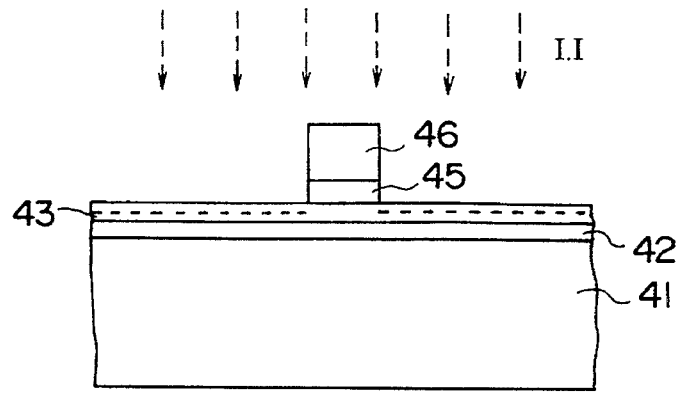
FIGS. 9A to 9C are sectional views showing a process of manufacturing a semiconductor device according to a sixth embodiment of the present invention.
Figure 9B:
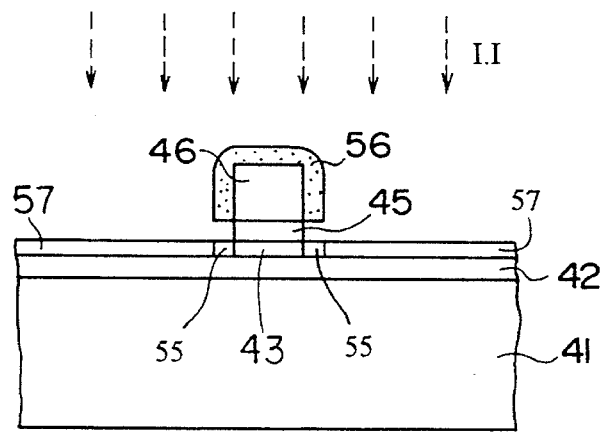
Figure 9C:
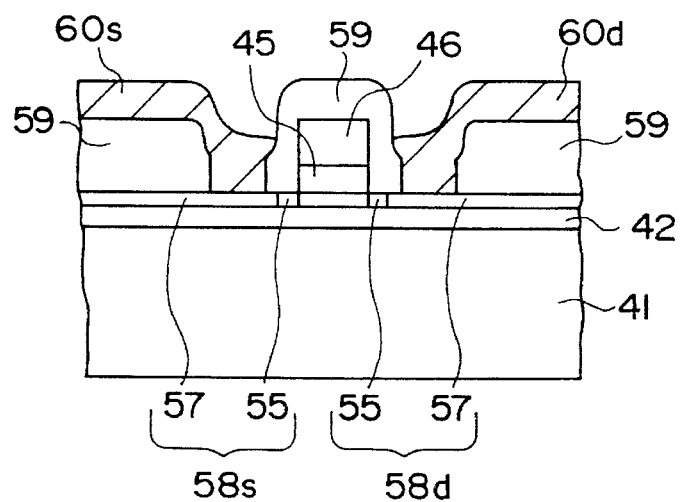

FIGS. 9A to 9C show a process of manufacturing a sixth embodiment of an insulated gate FET. In the present embodiment, a process of forming an n-channel TFT formed on an insulative transparent substrate will be described.

First, as shown in FIG. 9A, an oxide film 42 is formed in a thickness of 100 nm at a low temperature on an insulative transparent substrate 41 composed of quartz or glass, a silicon film 43 in an amorphous state is formed thereon in a thickness of 50 nm, and the silicon film 43 is polycrystallized by annealing the silicon film 43 at 600° C. Then, a gate insulating film 45 is formed in a thickness of 100 nm, and a gate electrode 46 is formed thereon. The method of growing these films and the method of forming the gate electrode 46 are the same as those in the fifth embodiment.

Next, the gate electrode 46 is used as a mask and the gate insulating film 45 at a part that is not covered with that mask is removed by RIE. Mixed gas of $CF_4$, $CHF_3$, $O_2$ and the like is used as etching gas.

In this state, phosphorus ions are implanted into the silicon film 43 under the conditions that the acceleration voltage is 40 KeV and the dose is $1 \times 10^{13} cm^{-2}$, thereby to form a first impurity region 55 in a self-align manner in the silicon film 43 on both sides of the gate electrode 46.

Next, as shown in FIG. 9B, a resist film 56 is formed on the top and the side of the gate electrode 46 by electrodeposition. As to the conditions of forming resist, for example, the gate electrode 46 and the insulative transparent substrate 41 are soaked in an electrolyte, voltage at 10 V is applied to the gate electrode 46 for 20 seconds, the resist film 56 is stuck to the surface of the gate electrode 46 in a thickness of approximately 0.5 μm, and this resist film 56 is used as a side wall. After the electrodeposition of the resist film 56 is completed, respective layers on the insulative transparent substrate 41 are washed by water, and then respective layers are dried in an oven under the conditions of 140° C. for one hour.

Thereafter, phosphorus ions are implanted into the silicon film 43 again under the conditions that the acceleration voltage is 15 KeV and the dose is $1 \times 10^{16} cm^{-2}$ from above the gate insulating film 45, thereby to form a second impurity region 57 such as shown in FIG. 9B in a self-align manner.

The first and the second impurity regions 55 and 57 are activated by annealing, and form a source region 58s and a drain region 58d having the LDD structure on both sides of the gate electrode 46.

Thereafter, following to the removal of the resist film 56, a $SiO_2$ film is formed in a thickness of 500 nm using a low-pressure CVD method as an interlayer insulating film 59 similarly to a conventional process of manufacturing a semiconductor element. Furthermore, contact holes for forming electrodes are opened in the interlayer insulating film 59, and a source electrode 60s and a drain electrode 60d composed of aluminum are connected to the source region 58s and the drain region 58d through these contact holes.

As described above, a TFT element having an LDD structure is formed. It is also easy in this embodiment to control the film thickness and the width of the side wall without depending on the height of the gate electrode.

Besides, impurities have been introduced into the silicon layer 43 before the resist film 56 is electrodeposited on the gate electrode 46 in the above description, but impurities may also be introduced after the resist film 56 is removed.

The Seventh Embodiment

Figure 10A:
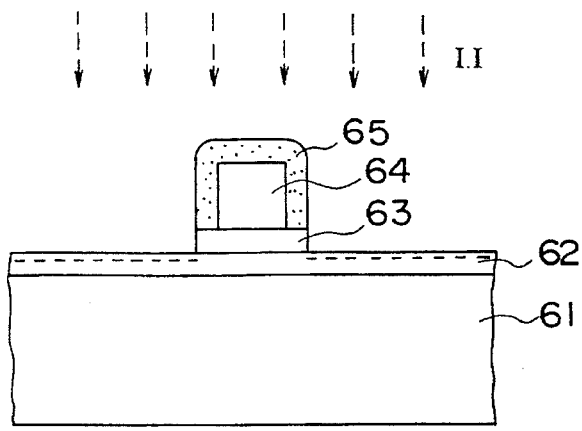
FIGS. 10A to 10C are sectional views showing a process of manufacturing a semiconductor device according to a seventh embodiment of the present invention.
Figure 10B:
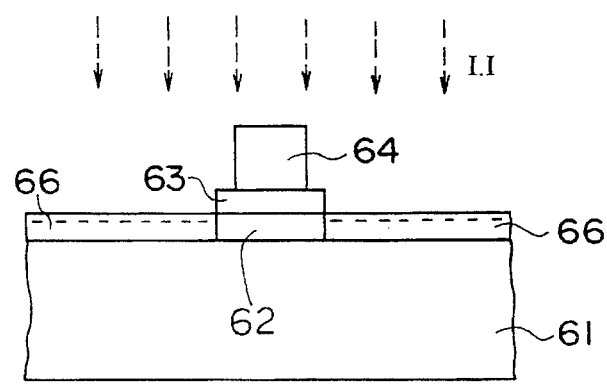
Figure 10C:
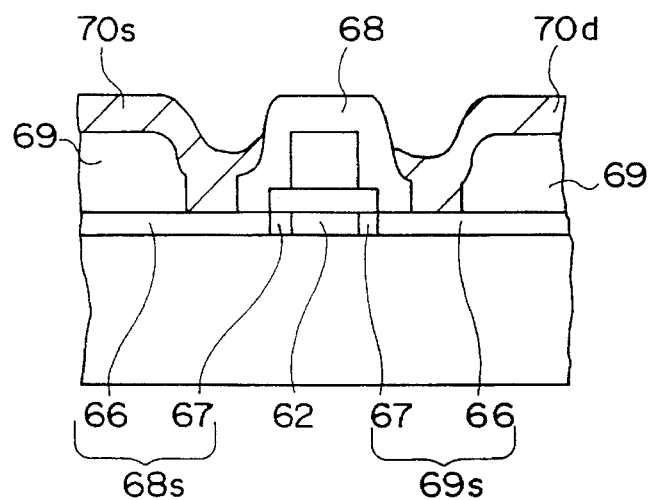

FIGS. 10A to 10C show a process of manufacturing a seventh embodiment of an insulated gate FET. In the present embodiment, a process of forming an n-channel TFT on an insulative transparent substrate is shown.

First, as shown in FIG. 10A, an amorphous silicon film 62 is formed in a thickness of 50 nm on an insulative transparent substrate 61 of quartz or the like by a low-pressure CVD method. Then, the silicon film 62 is polycrystallized by solid phase growth at approximately 600° C.

Furthermore, a gate insulating film 63 is formed in a thickness of 100 nm by an ECR plasma CVD method, then an aluminum film having a thickness of 100 nm is formed by a sputtering method, and patterning is applied to the aluminum film thereafter, thereby to form a gate electrode 64.

Next, a resist film 65 is formed on the top and the side of the gate electrode 64 by electrodeposition. As to a method of forming electrodeposited resist, for example, the insulative transparent substrate 61 and the gate electrode 64 are soaked in an electrolyte, voltage at 10 V is applied to the gate electrode 64 for 20 seconds so as to grow the resist film 65 in a thickness of approximately 0.5 μm on the surface of the gate electrode 64, and the resist film 65 is used as a side wall. After the electrodeposition of the resist film 65 is completed, the insulative transparent substrate 61 and a film thereon are washed by water, and then dried in an oven at 140° C. for one hour.

Next, the gate electrode 64 and the side wall by the resist film 65 are used as a mask, and the gate insulating film 63 at a part that is not covered with the mask is removed locally by RIE for instance. Mixed gas of $CF_4$, $CHF_3$ and $O_2$ is used as etching gas.

In this state, as shown in FIG. 10A, phosphorus ions are implanted directly into the semiconductor layer 62 under the conditions that the acceleration voltage is 15 KeV and the dose is $1 \times 10^{16} cm^{-2}$, thereby to form a first impurity region 66 in a self-align manner on the side of the gate electrode 64. In this case, the resist film 65 functions as a mask for checking introduction of impurities.

Next, after the resist film 65 is removed, phosphorus ions are implanted into the semiconductor layer 62 on the side of the gate electrode 64 under the conditions that the acceleration voltage is 40 KeV and the dose is $1 \times 10^{13} cm^{-2}$ as shown in FIG. 10B, thereby to form a second impurity region 67 in a self-align manner. In this case, a part of phosphorus ions penetrate through the gate insulating film 63 that has remained slightly around the gate electrode 64 and enter into the semiconductor layer 62, the second impurity region 67 exists a little to the gate electrode 64 from the first impurity region 66, and the impurity concentration thereof becomes lower than that of the first impurity region 66. Further, impurity ion implantation for the second time increases the concentration of the first impurity region 66.

The first and the second impurity regions 66 and 67 are activated by annealing, and become a source region 68s and a drain region 68d having an LDD structure on the side of the gate electrode 64.

Next, as shown in FIG. 10C, a $SiO_2$ film is formed in a thickness of 500 nm by a low-pressure CVD for instance as an interlayer insulating film 69 similarly to a conventional process of manufacturing a semiconductor element. Thereafter, contact holes for forming electrodes are opened in the interlayer insulating film 69, and a source electrode 70s and a drain electrode 70d composed of aluminum are connected to the source region 68s and the drain region 68d through these contact holes, respectively.

In such a manner as described above, a TFT element having an LDD structure is formed.

Besides, a high impurity concentration region may also be formed by forming a resist film (not shown) again on the surface of the gate electrode 64 by electrodeposition after the impurities are introduced into the semiconductor layer 62, and introducing impurities into the semiconductor layer 62 on both sides of the resist film again using the resist film as a mask.

Now, when impurities are introduced into the semiconductor layer 62 using the resist film 65 as a mask, the distribution in the impurity concentration plane in the semiconductor layer 62 shows higher concentration as becoming more distant from the gate electrode 64 by making implantation energy higher so that the impurities penetrate through the resist film 65 and the gate insulating film 63. In this case, it is not required to introduce impurities after the resist film 65 is removed.

The Eighth Embodiment

Figure 11A:
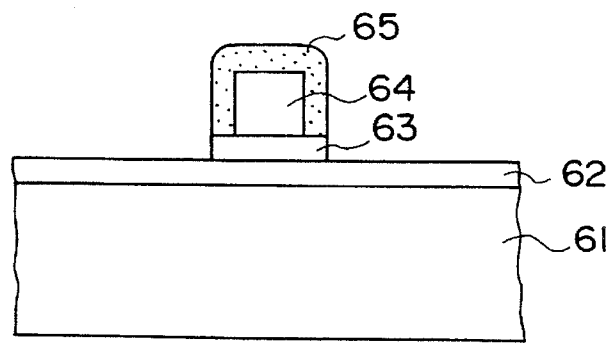
FIGS. 11A to 11C are sectional views showing a process of manufacturing a semiconductor device according to an eighth embodiment of the present invention.
Figure 11B:
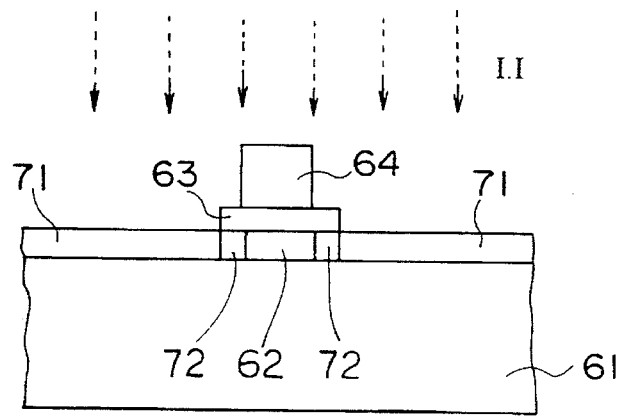
Figure 11C:
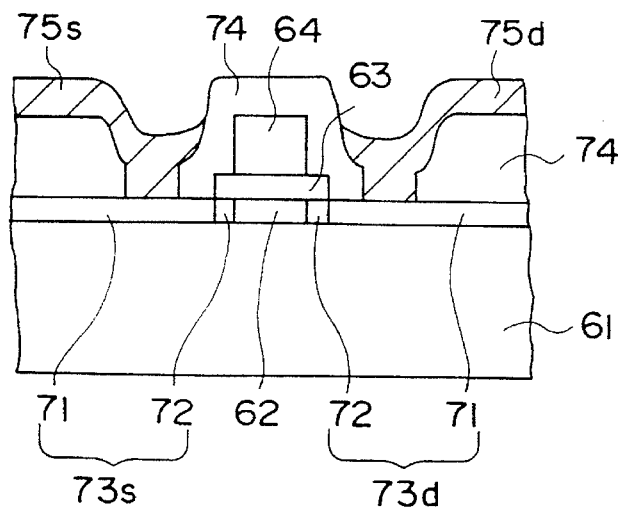

FIGS. 11A to 11C show sections of a manufacturing process of an eighth embodiment of an insulated gate FET.

First, as shown in FIG. 11A, after an amorphous silicon film 62 is formed in a thickness of 50 nm by a low-pressure CVD method on an insulative transparent substrate 61 composed of quartz or glass, the silicon film 62 is polycrystallized by solid phase growth at a heating temperature of 600° C.

Then, a gate insulating film 63 having a thickness of 100 nm is formed by ECR plasma CVD, and furthermore, an aluminum film having a thickness of 100 nm is formed by a sputtering method. The aluminum film becomes a gate electrode 64 by being applied with patterning. Furthermore, a resist film 65 is formed on the surface of the gate electrode 64 by electrodeposition, and then patterning is applied to the gate insulating film 63 using the resist film 65 as the mask. The details thereof are omitted since they have been described in the seventh embodiment.

In this state, when phosphorus ions are implanted into the semiconductor layer 62 under the conditions that the acceleration voltage is 15 KeV and the dose is $1 \times 10^{16} cm^{-2}$, the impurity concentration of the semiconductor layer 62 at a part where impurities have been implanted directly become approximately $1 \times 10^{21} cm^{-3}$, which becomes an n⁻ type impurity region 71 having comparatively high impurity concentration. Further, since the impurity concentration of the semiconductor layer 62 at a part where impurities have been introduced through the gate insulating film 63 becomes to show the concentration from approximately $1 \times 10^{19} cm^{-3}$ to approximately $1 \times 10^{20} cm^{-3}$, this part becomes an n⁻ type impurity region 72.

As a result, as shown in FIG. 11B, two impurity regions 71 and 72 having different concentration are formed by impurity introduction one time.

The n⁺ type impurity region 71 and the n⁻ type impurity region 72 are activated by annealing, thereby to form a source region 73s and a drain region 73d having an LDD structure on both sides of the gate electrode 64.

Next, as shown in FIG. 11C, a SiO₂ film is formed in a thickness of 500 nm by low-pressure CVD for instance as an interlayer insulating film 74 similarly to a conventional process of manufacturing a semiconductor element. Thereafter, contact holes for forming electrodes are opened in the interlayer insulating film 74, and a source electrode 75s and a drain electrode 75d composed of aluminum are formed in the source region 73s and the drain region 73d through the contact holes, respectively.

In such a manner as described above, a TFT element having an LDD structure is formed.

The Ninth Embodiment

Figure 12A:
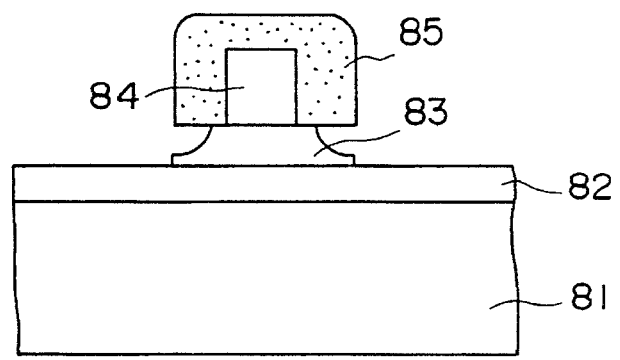
FIGS. 12A to 12C are sectional views showing a process of manufacturing a semiconductor device according to a ninth embodiment of the present invention.
Figure 12B:
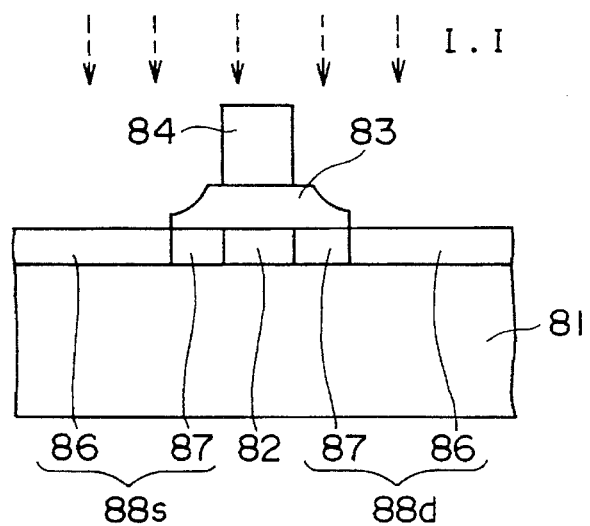
Figure 12C:
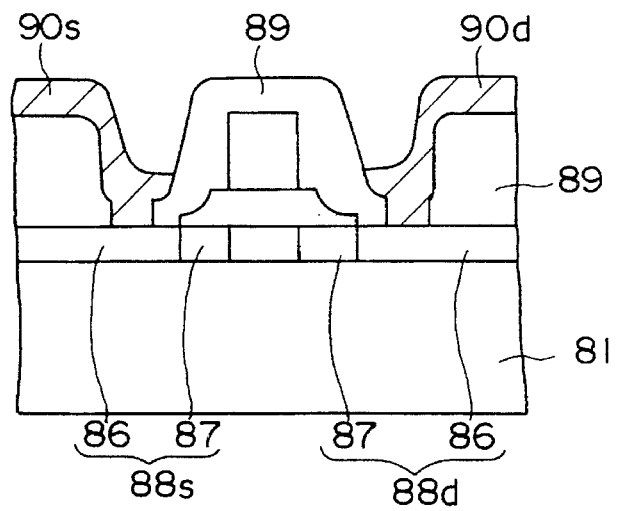

FIGS. 12A to 12C show a manufacturing process of a ninth embodiment of an insulated FET. In the present embodiment, a case that the present invention is applied to an n-channel TFT formed on an insulative transparent substrate is shown.

First, a process until a section shown in FIG. 12A is obtained will be described.

An amorphous silicon film 82 is formed in a thickness of 50 nm by a low-pressure CVD method on an insulative transparent substrate 81 composed of quartz or glass. Thereafter, the silicon film 82 is polycrystallized by solid phase growth at approximately 600° C.

Then, after a gate insulating film 83 having a thickness of 200 nm is formed by an ECR plasma CVD method, an aluminum film (not shown) having a thickness of 100 nm is formed on the gate insulating film 83 by a sputtering method. Then, patterning is applied to the aluminum film, thereby to form a gate electrode 84.

Next, a resist film 85 is formed on the top and the side of the gate electrode 84 by electrodeposition. As to the conditions of forming the resist film 85, for example, the gate electrode 84 is soaked in an electrolyte, voltage at 20 V is applied to the gate electrode 84 for 20 seconds so as to grow the resist film 85 in a thickness of 1 µm on the surface of the gate electrode 84, and the resist film 85 is used as a side wall. After the electrodeposition of the resist film 85 is completed, respective layers on the insulative transparent substrate 81 are washed by water, and then are dried in an oven at 140° C. for one hour.

Next, the gate electrode 84 and the resist film 85 are used as a mask, and the gate insulating film 83 at a part that is not covered by the mask is etched by RIE for instance. Mixed Gas of $CF_4$, $CHF_3$ and $O_2$ is used as etching gas. At this time, the Gate insulating film 83 is etched isotropically by changing a mixing ratio of the etching gas now, by changing the pressure of the etching atmosphere now and so on, thereby to form the gate insulating film 83 under the resist film 85 into a tapered shape as shown in FIG. 12A, and then the resist film 85 is removed.

In this state, when phosphorus ions are implanted into the semiconductor layer 82 under the conditions that the acceleration voltage is 15 KeV and the dose is $1\times10^{16}cm^{-2}$, the impurity concentration of the semiconductor layer 82 at a part where impurities are implanted directly into the semiconductor layer 82 becomes approximately $1\times10^{21}cm^{-3}$, thus forming a first impurity region 86 having comparatively high impurity concentration. Further, a second impurity region 87 in that the concentration of impurities introduced into the semiconductor layer 82 through the gate insulating film 83 changes by stages gradually so as to get higher as becoming more distant from the gate electrode 84 from approximately $1\times10^{19}cm^{-3}$ to approximately $1\times10^{21}cm^{-3}$ is formed.

As a result, as shown in FIG. 12B, it becomes possible to form two impurity regions 86 and 87 having different concentration by impurity introduction one time, and the first and the second impurity regions 86 and 87 are activated by annealing so as to form a source region 88s and a drain region 88d having an LDD structure on both sides of the gate electrode 84.

Next, as shown in FIG. 12C, a SiO₂ film is formed in a thickness of 500 nm using a low-pressure CVD method for instance as an interlayer insulating film 89. Thereafter, contact holes for forming electrodes are opened in the interlayer insulating film 89, and a source electrode 90s and a drain electrode 90d composed of aluminum are formed in the source region 88s and the drain region 88d through these contact holes, respectively.

In a TFT element having an LDD structure formed as described above, the distribution of the electric field strength when the voltage is applied becomes more smooth than that in a TFT element having a normal LDD structure since the impurity concentration in the LDD region changes continuously. Hence, the ability of controlling a leak current is improved.

Further, since the resist formed by electrodeposition is used as a mask when patterning is applied to the gate insulating film 83, vertical etching that has been heretofore adopted when a side wall is grown on the side of the gate electrode 84 becomes unnecessary. Thus, since the gate insulating film 83 is not removed when the side wall is formed, the trouble of regrowth can be saved.

What is claimed is:

1. A method of manufacturing a semiconductor device, comprising the steps of:

forming a gate electrode on a semiconductor layer through an insulating film;

soaking said gate electrode in an electrolyte containing resist, and applying voltage to said gate electrode, thereby to form a resist film on both sides and a top of said gate electrode; and introducing impurities into said semiconductor layer using said gate electrode and said resist film as a mask.

2. The method of manufacturing a semiconductor device according to claim 1, further comprising a step of introducing impurities into said semiconductor layer using said gate electrode as a mask before said resist film is formed.

3. The method of manufacturing a semiconductor device according to claim 1, wherein the film thickness of said resist film is regulated depending on the magnitude and the application period of time of the voltage applied to said gate electrode.

4. The method of manufacturing a semiconductor device according to claim 1, wherein said resist film is grown in a plurality of times separately, and said impurities are introduced into said semiconductor layer after every growth.

5. The method of manufacturing a semiconductor device according to claim 1, further comprising a step of introducing impurities again into said semiconductor layer with said gate electrode as a mask after said resist film is removed.

6. The method of manufacturing a semiconductor device according to claim 1, wherein, after melting said resist film by heating so as to extend the resist film in a transverse direction after said impurities are introduced into said semiconductor layer with said resist film as a mask, impurities are introduced again into said semiconductor layer with said resist film as a mask.

7. A method of manufacturing a semiconductor device, comprising the steps of:

forming gate electrodes through an insulating film in each of a plurality of active regions of a semiconductor layer;

soaking said plurality of gate electrodes in an electrolyte containing resist and applying voltage to said gate electrode located in said active region that has been selected, thereby to form a resist film on both sides and a top of said gate electrode; and introducing impurities into said semiconductor layer in said plurality of active regions with said gate electrodes and said resist film as a mask.

8. The method of manufacturing a semiconductor device according to claim 7, further comprising a step of introducing impurities into said semiconductor layer using said gate electrode as a mask before said resist film is formed.

9. The method of manufacturing a semiconductor device according to claim 7, wherein the film thickness of said resist film is regulated depending on the magnitude and the application period of time of the voltage applied to said gate electrode.

10. The method of manufacturing a semiconductor device according to claim 7, wherein said resist film is grown in a plurality of times separately, and said impurities are introduced into said semiconductor layer after every growth.

11. The method of manufacturing a semiconductor device according to claim 7, further comprising a step of introducing impurities again into said semiconductor layer with said gate electrode as a mask after said resist film is removed.

12. The method of manufacturing a semiconductor device according to claim 7, wherein, after melting said resist film by heating so as to extend the resist film in a transverse direction after said impurities are introduced into said semiconductor layer with said resist film as a mask, impurities are introduced again into said semiconductor layer with said resist film as a mask.

13. A method of manufacturing a semiconductor device, comprising the steps of:

forming a gate electrode on a semiconductor layer through an insulating film;

applying patterning to said insulating film with said gate electrode as a mask;

introducing impurities into said semiconductor layers with said gate electrode as a mask;

soaking said gate electrode in an electrolyte containing resist, and applying voltage to said gate electrode, thereby to form resist films on both sides and a top of said gate electrode; and introducing impurities into said semiconductor layers with said resist films as a mask.

14. A method of manufacturing a semiconductor device, comprising the steps of:

forming a gate electrode on a semiconductor layer through an insulating film;

applying patterning to said insulating film with said gate electrode as a mask;

soaking said electrode in an electrolyte containing resist, and applying voltage to said gate electrode, thereby to form a resist film on both sides and a top of said electrode;

introducing impurities into said semiconductor layers with said resist film as a mask;

removing said resist film; and introducing impurities into said semiconductor layers with said gate electrode as a mask.

15. A method of manufacturing a semiconductor device, comprising the steps of:

forming a gate electrode on a semiconductor layer through an insulating film;

soaking said gate electrode in an electrolyte containing resist, and applying voltage to said gate electrode, thereby to form a resist film on both sides and a top of said gate electrode;

applying patterning to said insulating film with said gate electrode and said resist film as a mask;

introducing impurities into said semiconductor layer with said gate electrode and said resist film as a mask;

removing said resist film; and introducing impurities into said semiconductor layer with said gate electrode as a mask.

16. A method of manufacturing a semiconductor device, comprising the steps of:

forming a gate electrode on a semiconductor layer through an insulating film;

soaking said gate electrode in an electrolyte containing resist, and applying voltage to said gate electrode, thereby to form a resist film on both sides and a top of said gate electrode;

applying patterning to said insulating film with said gate electrode and said resist film as a mask;

removing said resist film; and introducing impurities into said semiconductor layer with said gate electrode as a mask and with energy that a part thereof passes through said insulating film that has been applied with patterning, thereby to form impurity regions in which impurity concentration is made higher gradually from the gate electrode toward the outside.

17. The method of manufacturing a semiconductor device according to claim 16, further comprising the steps of:

forming a second resist film on the surface of said gate electrode using an electrolyte containing resist after impurities are introduced into said semiconductor layer; and introducing impurities into said semiconductor layer with said second resist film as a mask.

18. A method of manufacturing a semiconductor device, comprising the steps of:

forming a gate electrode on a semiconductor layer through an insulating film;

soaking said gate electrode in an electrolyte containing resist, and applying voltage to said gate electrode, thereby to form a resist film on both sides and a top of said gate electrode;

applying patterning to said insulating film with said gate electrode and said resist film as a mask; and introducing impurities into said semiconductor layer with implantation energy that a part thereof penetrates through said resist film and said insulating film, thereby to form an impurity region in which the concentration of said impurities is made higher gradually from said gate electrode toward both sides thereof by introduction of impurities one time.

19. A method of manufacturing a semiconductor device, comprising the steps of:

forming a gate electrode on a semiconductor layer through an insulating film;

soaking said gate electrode in an electrolyte containing resist, and applying voltage to said gate electrode, thereby to form a resist film on both sides and a top of said gate electrode;

etching said insulating film isotropically with said gate electrode and said resist film as a mask, thereby to form said insulating film under said resist film in a taper configuration;

removing said resist film; and introducing impurities with said electrode as a mask and with implantation energy that a part thereof penetrates through said insulating film.

20. A method of manufacturing a liquid crystal display including a process of forming a pixel portion and a peripheral circuit having a TFT on a transparent substrate, comprising the steps of:

forming a semiconductor layer on the transparent substrate of said pixel portion:

forming a gate electrode of said TFT on said semiconductor layer through an insulating film;

soaking said gate electrode in electrodeposition liquid containing resist and applying voltage to said gate electrode, thereby to form a resist film on the surface of said gate electrode; and introducing impurities into said semiconductor layer with said gate electrode and said resist film as a mask.

21. The method of manufacturing a liquid crystal display according to claim 20, wherein a plurality of said gate electrodes are formed on said semiconductor layer, said plurality of gate electrodes are connected electrically to one generalization electrode through a plurality of gate bus lines in a state that said gate electrodes are soaked in said electrodeposition liquid containing resist, and said voltage is applied to said plurality of gate electrodes through said generalization electrode.

* * * * *

UNITED STATES PATENT AND TRADEMARK OFFICE
CERTIFICATE OF CORRECTION

PATENT NO. : 5,518,940
DATED : May 21, 1996
INVENTOR(S) : Hodate et al.

It is certified that error appears in the above-indentified patent and that said Letters Patent is hereby corrected as shown below:

Column 8, line 24, delete "$n^-$" first occurrence and insert --$n^{--}$--

Column 8, line 38, delete "$n^-$" and insert --$n^{--}$--

Column 8, line 54, delete "$n^-$" and insert --$n^{--}$--

Column 8, line 62, delete "$n^-$" and insert --$n^+$--

Column 11, line 13, delete "Aa" and insert --As--

UNITED STATES PATENT AND TRADEMARK OFFICE
CERTIFICATE OF CORRECTION

PATENT NO. : 5,518,940
DATED : May 21, 1996
INVENTOR(S) : Hodate et al.

It is certified that error appears in the above-indentified patent and that said Letters Patent is hereby corrected as shown below:

Column 14, line 55, delete "$n^-$" and insert --$n^+$--

Signed and Sealed this

Eighth Day of July, 1997

Attest:

BRUCE LEHMAN

*Attesting Officer*    *Commissioner of Patents and Trademarks*